United States Patent
Sueoka

(10) Patent No.: US 10,459,053 B2
(45) Date of Patent: Oct. 29, 2019

(54) MAGNETIC RESONANCE IMAGING APPARATUS AND MAGNETIC RESONANCE IMAGING METHOD

(71) Applicant: Toshiba Medical Systems Corporation, Otawara-shi (JP)

(72) Inventor: Kazuhiro Sueoka, Otawara (JP)

(73) Assignee: Canon Medical Systems Corporation, Otawara-shi (JP)

(*) Notice: Subject to any disclaimer, the term of this patent is extended or adjusted under 35 U.S.C. 154(b) by 139 days.

(21) Appl. No.: 15/852,708

(22) Filed: Dec. 22, 2017

(65) Prior Publication Data

US 2018/0180694 A1 Jun. 28, 2018

(30) Foreign Application Priority Data

Dec. 26, 2016 (JP) .................................. 2016-251960

(51) Int. Cl.
| | |
|---|---|
| *G01R 33/50* | (2006.01) |
| *G01R 33/48* | (2006.01) |
| *G01R 33/54* | (2006.01) |
| *G01R 33/56* | (2006.01) |
| *G01R 33/561* | (2006.01) |

(52) U.S. Cl.
CPC ......... *G01R 33/50* (2013.01); *G01R 33/4816* (2013.01); *G01R 33/546* (2013.01); *G01R 33/5602* (2013.01); *G01R 33/5616* (2013.01)

(58) Field of Classification Search
CPC .. G01R 33/50; G01R 33/546; G01R 33/5602; G01R 33/5616; G01R 33/4816
See application file for complete search history.

(56) References Cited

U.S. PATENT DOCUMENTS

| | | | |
|---|---|---|---|
| 2015/0108976 A1* | 4/2015 | Fischer | G01R 33/5616 324/309 |
| 2015/0310650 A1 | 10/2015 | Lu et al. | |
| 2016/0054416 A1* | 2/2016 | Stehning | A61B 5/055 600/411 |

FOREIGN PATENT DOCUMENTS

| | | |
|---|---|---|
| JP | 2011-229638 | 11/2011 |
| JP | 2015-208681 | 11/2015 |

OTHER PUBLICATIONS

O.M. Girard et al. "Optimization of Iron Oxide Nanoparticle Detection Using Ultrashort TE Pulse Sequences: Comparison of T1, T2 and Synergistic T1-T2 Contrast Mechanisms," Magnetic Resonance in Medicine, National Institute of Health, Jun. 2011, pp. 21.

* cited by examiner

*Primary Examiner* — Susan S Lee

(74) *Attorney, Agent, or Firm* — Oblon, McClelland, Maier & Neustadt, L.L.P.

(57) ABSTRACT

A magnetic resonance imaging apparatus according to an embodiment includes sequence control circuitry and processing circuitry. The sequence control circuitry executes a first pulse sequence to acquire multiple sets of data with different echo times (TEs), the first pulse sequence being a pulse sequence of an ultrashort echo time (UTE) imaging technique and being a multi-echo pulse sequence. The processing circuitry derives a value of a TE (Echo Time) in a second pulse sequence executed by the sequence control circuitry based on the multiple sets of data.

14 Claims, 7 Drawing Sheets

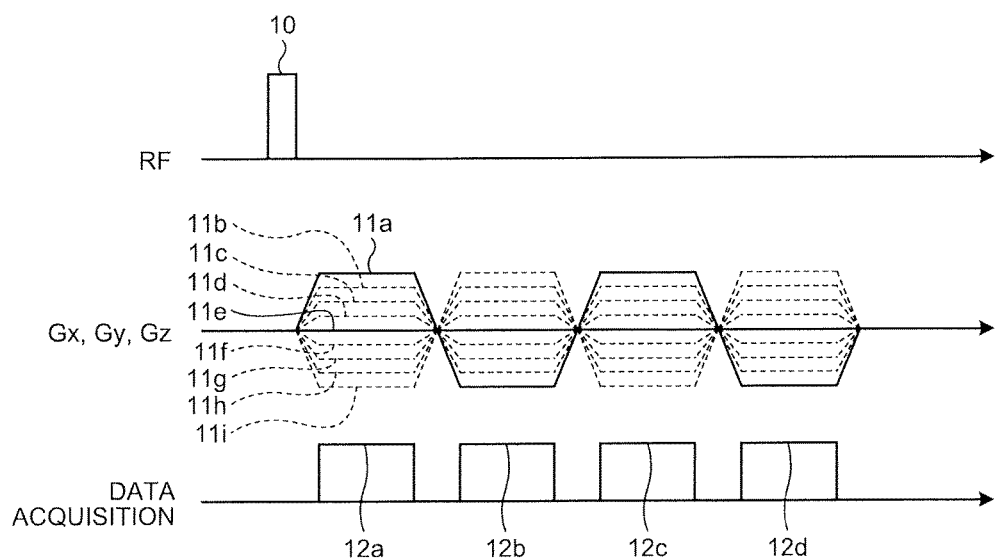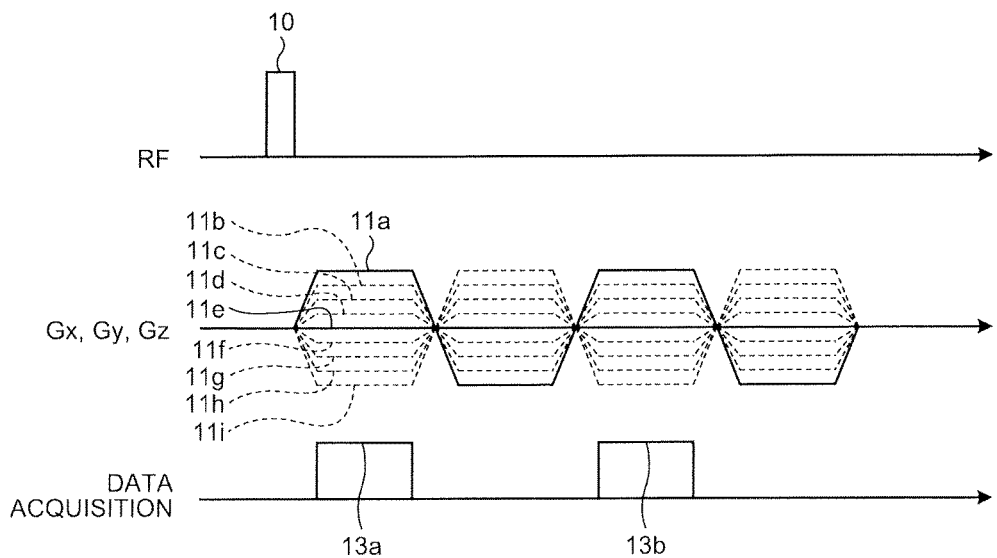

FIG.8
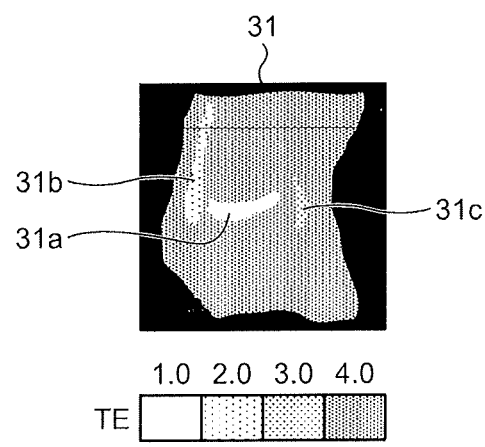
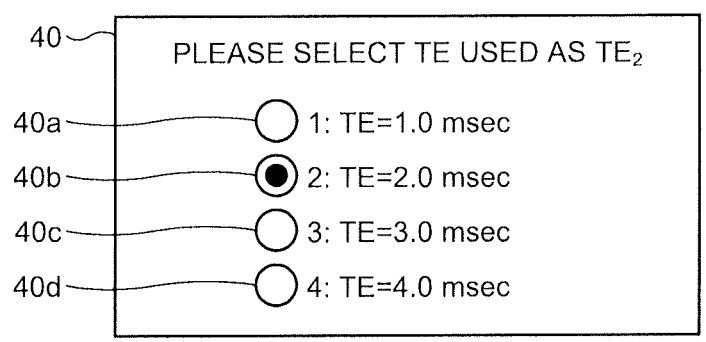

FIG.9
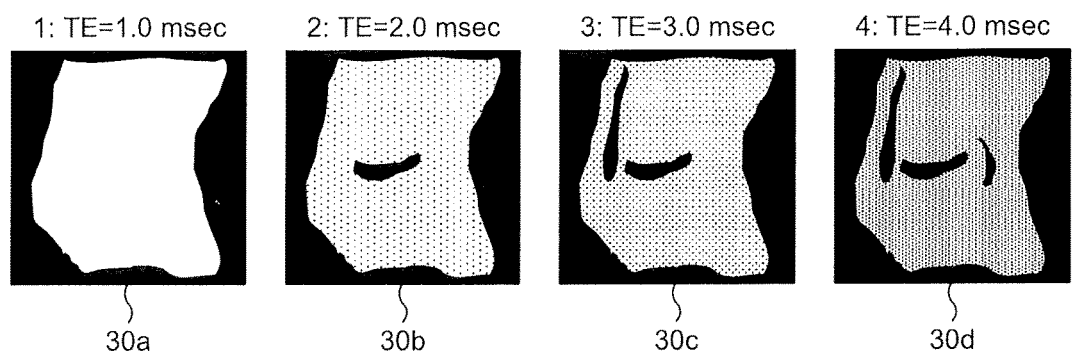
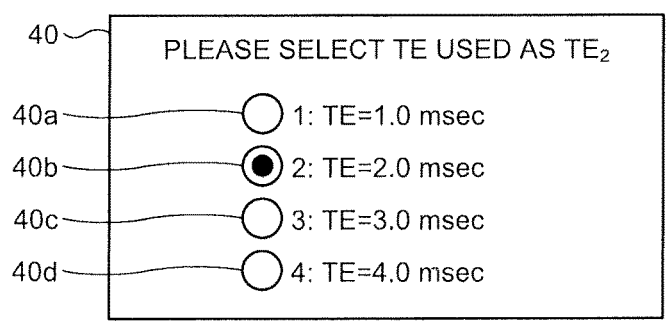

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2016-251960, filed on Dec. 26, 2016; the entire contents of which are incorporated herein by reference.

FIELD

Embodiments described herein relate generally to a magnetic resonance imaging apparatus.

BACKGROUND

In magnetic resonance imaging, in an imaging technique such as an ultrashort echo time (UTE) imaging technique, tissues with a short $T_2^*$ value can be depicted, where $T_2^*$ value is a $T_2$ value that is in consideration of inhomogeneity of a magnetic field. This makes it possible to depict tissues such as cartilages or joints, which are difficult to depict according to conventional techniques.

As a possible method for depicting tissues with a short $T_2^*$ value, there is a method in which subtraction is executed between an image acquired in a small echo time (TE) and an image acquired in a large TE.

However, as the $T_2^*$ value differs depending on each site or tissue that is the target to be imaged, it is sometimes difficult to determine in advance in which TEs the images are optimally acquired to perform subtraction between them.

BRIEF DESCRIPTION OF THE DRAWINGS

FIG. 2 is a diagram that illustrates an example of the pulse sequence executed by the magnetic resonance imaging apparatus according to the embodiment;

FIG. 3 is a diagram that illustrates another example of the pulse sequence executed by the magnetic resonance imaging apparatus according to the embodiment;

FIG. 8 is an example of the screen displayed by the magnetic resonance imaging apparatus according to the first embodiment;

FIG. 9 is an example of the screen displayed by the magnetic resonance imaging apparatus according to the first embodiment;

DETAILED DESCRIPTION

A magnetic resonance imaging apparatus according to an embodiment includes sequence control circuitry and processing circuitry. The sequence control circuitry executes a first pulse sequence to acquire multiple sets of data with different echo times (TEs), the first pulse sequence being a pulse sequence of an ultrashort echo time (UTE) imaging technique and being a multi-echo pulse sequence. The processing circuitry derives a value of a TE (Echo Time) in a second pulse sequence executed by the sequence control circuitry based on the multiple sets of data.

A magnetic resonance imaging apparatus according to an embodiment is explained below in detail with reference to the attached drawings.

First Embodiment

Figure 1:
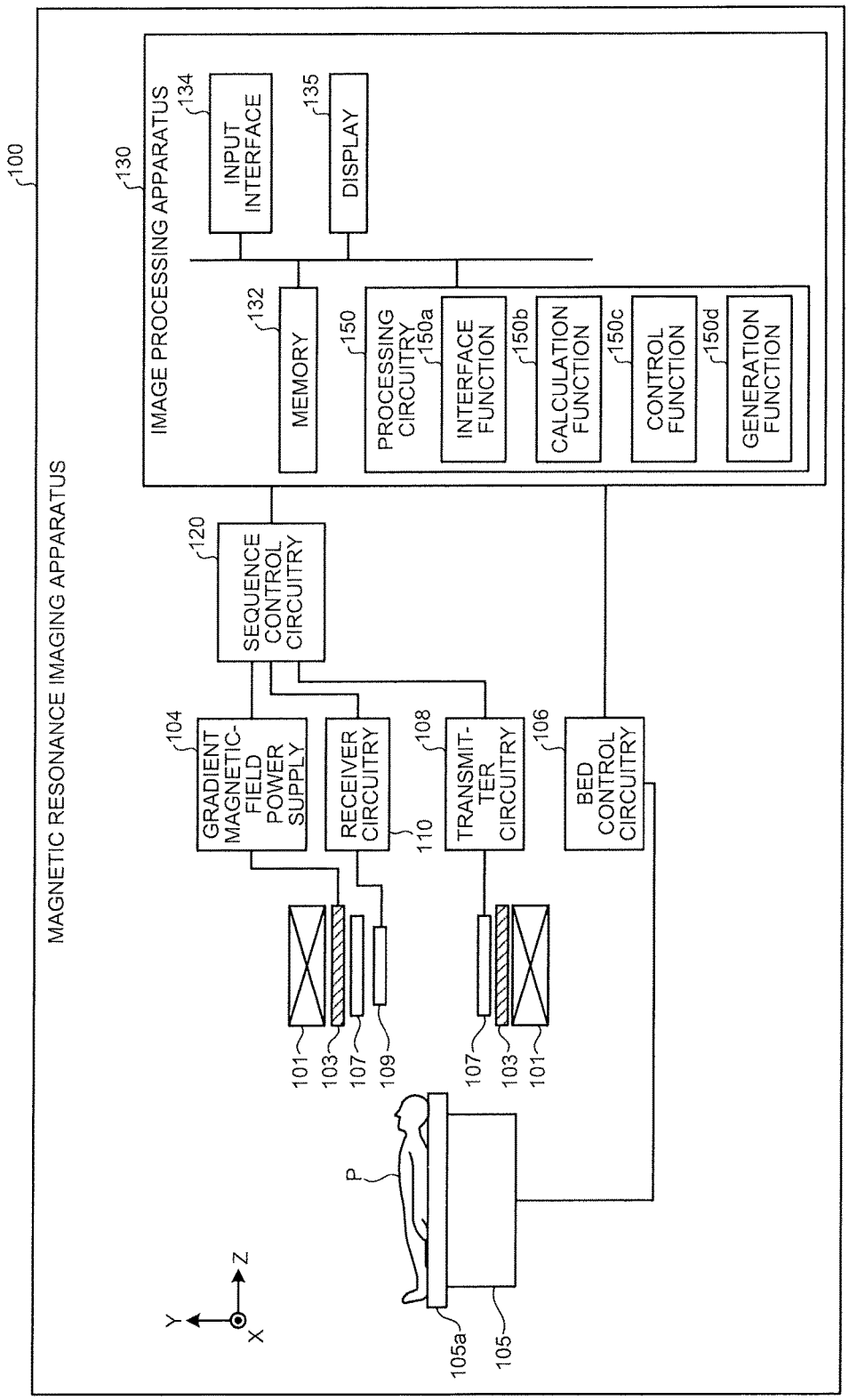
FIG. 1 is a diagram that illustrates a magnetic resonance imaging apparatus according to an embodiment.

FIG. 1 is a block diagram that illustrates a magnetic resonance imaging apparatus 100 according to the embodiment. As illustrated in FIG. 1, the magnetic resonance imaging apparatus 100 includes a static field magnet 101, a gradient coil 103, a gradient magnetic field power supply 104, a bed 105, bed control circuitry 106, a transmitter coil 107, transmitter circuitry 108, a receiver coil 109, receiver circuitry 110, sequence control circuitry 120, and an image processing apparatus 130. Here, the magnetic resonance imaging apparatus 100 does not include a subject P (e.g., human body). Furthermore, the configuration illustrated in FIG. 1 is only an example. For example, a configuration may be such that various units in the sequence control circuitry 120 and the image processing apparatus 130 are combined or separated as appropriate. Furthermore, the magnetic resonance imaging apparatus 100 may include static magnetic field power supply not illustrated.

The static field magnet 101 is a magnet that is formed to have substantially a cylindrical shape with a hollow, and it generates a static magnetic field in its internal space. The static field magnet 101 is, for example, a superconductive magnet, and it receives currents supplied from the static magnetic field power supply to be magnetically excited. The static magnetic field power supply supplies currents to the static field magnet 101. Here, the static field magnet 101 may be a permanent magnet, and in this case, the magnetic resonance imaging apparatus 100 need not include a static magnetic field power supply. Furthermore, the static magnetic field power supply may be provided separately from the magnetic resonance imaging apparatus 100.

The gradient coil 103 is a coil that is formed to have substantially a cylindrical shape with a hollow, and it is provided on the inner side of the static field magnet 101. The gradient coil 103 is formed by combining three coils that correspond to the respective X, Y, and Z axes that run at right angles to one another; the three coils receive currents that are individually supplied from the gradient magnetic field power supply 104, and they generate gradient magnetic fields whose magnetic field intensities change along the respective X, Y, and Z axes. The gradient magnetic fields in the respective X, Y, and Z axes generated by the gradient coil 103 are for example a slice direction gradient magnetic field Gz, a phase encode direction gradient magnetic field Gy, and a readout direction gradient magnetic field Gx. The gradient magnetic field power supply 104 supplies currents to the gradient coil 103.

The bed 105 includes a top board 105a on which the subject P is placed, and under the control of the bed control circuitry 106, inserts the top board 105a through a hollow (imaging opening) of the gradient coil 103 in a state where the subject P is placed. Typically, the bed 105 is provided such that its longitudinal direction is parallel to the central axis of the static field magnet 101. Under the control of the image processing apparatus 130, the bed control circuitry 106 drives the bed 105 to move the top board 105a in a longitudinal direction and in a vertical direction.

The transmitter coil 107 is provided on the inner side of the gradient coil 103 to receive radio frequency (RF) pulses that are supplied from the transmitter circuitry 108 and generate a high-frequency magnetic field. The transmitter circuitry 108 supplies RF pulses which correspond to the Larmor frequency that is defined according to the type of target atom and the magnetic field intensity, to the transmitter coil 107.

The receiver coil 109 is provided on the inner side of the gradient coil 103 to receive magnetic resonance signals that are generated from the subject P due to the effect of the high-frequency magnetic field. If magnetic resonance signals are received, the receiver coil 109 outputs the received magnetic resonance signals to the receiver circuitry 110.

Furthermore, the transmitter coil 107 and the receiver coil 109 which are described above, are only examples. They may be configured with one or more coils combined out of a coil that has only a transmitting function, a coil that has only a receiving function, and a coil that has a transmitting/receiving function.

The receiver circuitry 110 detects magnetic resonance signals output from the receiver coil 109 and generates magnetic resonance data based on the detected magnetic resonance signals. Specifically, the receiver circuitry 110 executes digital conversion on the magnetic resonance signals output from the receiver coil 109, thereby generating magnetic resonance data. Furthermore, the receiver circuitry 110 transmits the generated magnetic resonance data to the sequence control circuitry 120. Here, the receiver circuitry 110 may be provided on the side of a gantry device that includes the static field magnet 101, the gradient coil 103, and the like.

The sequence control circuitry 120 drives the gradient magnetic field power supply 104, the transmitter circuitry 108, and the receiver circuitry 110 on the basis of the sequence information transmitted from the image processing apparatus 130, thereby capturing the subject P. Here, the sequence information is information that defines the procedure for imaging. The sequence information defines the intensity of currents supplied to the gradient coil 103 by the gradient magnetic field power supply 104, the timing at which currents are supplied, the intensity of RF pulses supplied to the transmitter coil 107 by the transmitter circuitry 108, the timing at which RF pulses are applied, the timing at which the receiver circuitry 110 detects magnetic resonance signals, or the like. For example, the sequence control circuitry 120 is an integrated circuit, such as an application specific integrated circuit (ASIC) or a field programmable gate array (FPGA), or an electronic circuit, such as a central processing unit (CPU) or a micro processing unit (MPU).

According to the first embodiment, the sequence control circuitry 120 executes the first pulse sequence for determining the echo time (TE) for the second pulse sequence which is performed subsequent to the first pulse sequence, and the second pulse sequence for obtaining final medical image.

FIGS. 2 and 3 illustrate examples of the pulse sequence executed by the sequence control circuitry 120 according to the first embodiment. FIGS. 2 and 3 are diagrams that illustrate examples of the pulse sequence executed by the magnetic resonance imaging apparatus according to the embodiment. Both FIGS. 2 and 3 are pulse sequences according to the ultrashort echo time (UTE) imaging technique; FIG. 2 is an example of the pulse sequence where there is no flyback that is an application of a gradient magnetic field to align positions in the k-space during data acquisition, while FIG. 3 illustrates the pulse sequence where there is flyback that is an application of a gradient magnetic field to align positions in the k-space during data acquisition. In both FIGS. 2 and 3, an explanation is given of a case where three-dimensional radial acquisition is executed.

The upper section of FIG. 2 illustrates the RF pulse that is applied by the sequence control circuitry 120. The middle section of FIG. 2 illustrates the gradient magnetic fields (the readout direction gradient magnetic field Gx, the phase encode direction gradient magnetic field Gy, and the slice direction gradient magnetic field Gz) that are applied by the sequence control circuitry 120. Furthermore, the lower section of FIG. 2 illustrates the timing at which data acquisition is executed.

An RF pulse 10 represents the RF pulse that is applied according to the ultrashort echo time (UTE) imaging technique. The RF pulse 10 may be, for example, a half pulse that is shaped like a half wave or may be pulses other than the half pulse. According to the UTE imaging technique, for example, as the RF pulse 10 is combined with a gradient echo, 180-degree pulses during spin echo or phase encoding may be omitted, and an echo may be generated immediately after the RF pulse 10 is applied. The UTE imaging technique is an imaging technique acquiring data of short TE (Echo Time) by radial acquisition. Here, a short TE means less than a few hundred microseconds (e.g. TE of less than 300 microseconds). It is noted that as the first pulse sequence that is a pulse sequence of the UTE imaging technique and that is a multi-echo pulse sequence, it is not necessary that all of the plurality of echoes generated be short. It is sufficient if at least one of the plurality of echoes generated is short (UTE).

A gradient magnetic field 11a indicated with a solid line schematically illustrates the intensity of the gradient magnetic field applied by the sequence control circuitry 120 in response to the RF pulse 10. In FIG. 2, the gradient magnetic field 11a is applied alternately in a positive direction and a negative direction by changing the polarity. Gradient echo is generated primarily with the part where the intensity of the gradient magnetic field is flat; therefore, while an echo is generated, data acquisition is executed. Here, the gradient magnetic field 11a schematically illustrates time changes in the intensities of the gradient magnetic fields in three axes, i.e., the readout direction gradient magnetic field Gx, the phase encode direction gradient magnetic field Gy, and the slice direction gradient magnetic field Gz, and in actuality, the gradient magnetic field in each axis is simultaneously applied at an appropriate ratio corresponding to the acquired spoke in the k-space. For example, when a spoke is acquired in the k-space that is represented by the equation of $k_x/A=k_y/B=k_z/C$, the ratio of the intensities of the readout direction gradient magnetic field $G_x$, the phase encode direction gradient magnetic field $G_y$, and the slice direction gradient magnetic field $G_z$ is $G_x:G_y:G_z=A:B:C$. The sequence control circuitry 120 simultaneously applies the readout direction gradient magnetic field $G_x$, the phase encode direction gradient magnetic field $G_y$, and the slice direction gradient magnetic field $G_z$ according to the above intensity ratio.

Furthermore, a data acquisition period 12a, a data acquisition period 12b, a data acquisition period 12c, and a data acquisition period 12d represent the periods during which data acquisition is executed. According to the first embodiment, the sequence control circuitry 120 executes a multi-echo pulse sequence which is a pulse sequence of the UTE imaging technique, as the first pulse sequence. Here, the multi-echo means multiple echoes generated in response to a single RF pulse. In the example of FIG. 2, four echoes are generated in total, i.e., the echo that corresponds to the data acquisition period 12a, the echo that corresponds to the data acquisition period 12b, the echo that corresponds to the data acquisition period 12c, and the echo that corresponds to the data acquisition period 12d, in response to the RF pulse 10. Each of the echoes has a different echo time (TE).

Here, for the data acquisition period 12a and the data acquisition period 12c, the polarities of the applied gradient magnetic fields are the same, and two acquisitions are executed on the same position in the k-space by changing the TE. Furthermore, for the data acquisition period 12b and the data acquisition period 12d, the polarities of the applied gradient magnetic fields are the same, and two acquisitions are executed on the same position in the k-space by changing the TE. Moreover, for the data acquisition period 12a and the data acquisition period 12b, the polarities of the applied gradient magnetic fields are opposite, and two acquisitions are executed on the opposite positions with respect to the origin in the k-space.

Summarizing the above, the sequence control circuitry 120 acquires multiple sets of data with different TEs with regard to the same spoke in the k-space during, for example, the data acquisition period 12a and the data acquisition period 12c in response to the single RF pulse 10. During a single data acquisition period, e.g., the data acquisition period 12a, a position in the k-space to be acquired changes based on a predetermined spoke. The spoke in the k-space to be acquired is determined according to the intensity ratio of the readout direction gradient magnetic field $G_x$, the phase encode direction gradient magnetic field $G_y$, and the slice direction gradient magnetic field $G_z$ that are applied.

Furthermore, a gradient magnetic field 11b indicated with a dotted line schematically illustrates the intensity of the gradient magnetic field applied by the sequence control circuitry 120 in response to the RF pulse that is applied subsequent to the RF pulse 10. The sequence control circuitry 120 changes the ratio of intensities with which the readout direction gradient magnetic field $G_x$, the phase encode direction gradient magnetic field $G_y$, and the slice direction gradient magnetic field $G_z$ are applied, from the one in the case of the RF pulse 10 so as to execute data acquisition on a different spoke in the k-space. In the same manner, gradient magnetic fields 11c, 11d, 11e, 11f, 11g, 11h, and 11i schematically illustrate the intensities of the gradient magnetic fields that are applied by changing the ratio of intensities of the gradient magnetic fields in the three axes applied by the sequence control circuitry 120 in response to different RF pulses. The sequence control circuitry 120 executes this pulse sequence so as to acquire data in the entire three-dimensional k-space.

Furthermore, examples of the pulse sequence executed by the sequence control circuitry 120 are not limited to the example in FIG. 2, and as in for example FIG. 3, it is possible to execute a pulse sequence in a case where there is flyback. In such a case, the sequence control circuitry 120 executes data acquisition during a data acquisition period 13a and a data acquisition period 13b. Due to the effect of the gradient magnetic field applied between the data acquisition period 13a and the data acquisition period 13b, the position in the k-space acquired during the data acquisition period 13b is the same as the position in the k-space acquired during the data acquisition period 13a. In this way, the sequence control circuitry 120 acquires multiple sets of data with different TEs with respect to the same position in the k-space. In a case where there is flyback, an acquisition time is longer than that in a case where there is no flyback. Furthermore, as the position in the k-space acquired with a single RF pulse is the same, there is an advantage that errors are more unlikely to occur in a case where there is flyback, as compared to a case where there is no flyback.

Furthermore, high-resolution images do not need to be generated during the first pulse sequence, contrary to the second pulse sequence for generating images used for clinical diagnosis; therefore, the resolution of acquired image data may be reduced by decreasing an acquisition density in the k-space, or the like, so that conditions are specified such that, for example, scan is completed in about several tens of seconds. The first pulse sequence plays the role of a pre-scan that is executed prior to the acquisition of image data used for clinical diagnosis.

Furthermore, examples of the second pulse sequence executed by the sequence control circuitry 120 may include the same sequence as the first pulse sequence or sequences different from the first pulse sequence.

Furthermore, examples of the pulse sequence executed by the sequence control circuitry 120 are not limited to the above-described example. For example, the sequence control circuitry 120 may perform pulse sequences of other gradient echo systems. For example, the sequence control circuitry 120 may use pulse sequences of Pointwise Encoding Time reduction with Radial Acquisition (PETRA) to combine radial acquisition and Cartesian acquisition.

Furthermore, although an explanation is given of a case where the pulse sequence executed by the sequence control circuitry 120 is 3D radial scan, this is not a limitation on the embodiment. The sequence control circuitry 120 may use pulse sequences for 2D scan as the first pulse sequence or the second pulse sequence. Furthermore, multiple lines (spokes) in the k-space may be acquired with a single RF pulse, or conversely multiple RF pulses may be used to acquire a single line in the k-space.

As a result of capturing the subject P by driving the gradient magnetic field power supply 104, the transmitter circuitry 108, and the receiver circuitry 110 as described above, the sequence control circuitry 120 receives magnetic resonance data from the receiver circuitry 110 and then transmits the received magnetic resonance data to the image processing apparatus 130.

The image processing apparatus 130 performs the overall control on the magnetic resonance imaging apparatus 100, generates images, or the like. The image processing apparatus 130 includes memory 132, an input interface 134, a display 135, and processing circuitry 150. The processing circuitry 150 includes an interface function 150a, a calculation function 150b, a control function 150c, and a generation function 150d.

According to the first embodiment, the respective processing functions performed by the interface function 150a, the calculation function 150b, the control function 150c, and the generation function 150d are stored in the memory 132 in the form of program executable by a computer. The processing circuitry 150 is a processor that reads programs from the memory 132 and executes them to implement functions that correspond to the programs. In other words, the processing circuitry 150 in a state where each program has been read has each function illustrated in the processing circuitry 150 in FIG. 1. Furthermore, in the explanation of FIG. 1, the single processing circuitry 150 implements the processing functions that are performed by the interface function 150a, the calculation function 150b, the control function 150c, and the generation function 150d; however, the processing circuitry 150 may be configured by combining multiple independent processors so that each processor executes a program to implement the function.

In other words, there may be a case where each of the above-described functions is configured as a program and a single processing circuitry executes each program, or there may be a case where a specific function is implemented by a dedicated independent program execution circuit.

The term "processor" used in the above explanation means, for example, a central processing unit (CPU), a graphical processing unit (GPU), or a circuit, such as an Application Specific Integrated Circuit (ASIC), a programmable logic device (e.g., a simple programmable logic device (SPLD), a complex programmable logic device, or a field programmable gate array (FPGA)). The processor reads the program stored in the memory 132 and executes it, thereby implementing the function.

Here, the calculation function 150b, the control function 150c, the generation function 150d, and the display 135 are examples of a calculating unit, a control unit, a generating unit, and a display unit. Furthermore, the sequence control circuitry 120 is an example of a sequence control unit.

Furthermore, instead of storing programs in the memory 132, a configuration may be such that programs are directly installed in a circuit of a processor. In this case, the processor reads the program installed in the circuit and executes it, thereby implementing the function. Here, the bed control circuitry 106, the transmitter circuitry 108, the receiver circuitry 110, and the like, are configured by using electronic circuits, such as the above-described processors, in the same manner.

The processing circuitry 150 uses the interface function 150a to transmit sequence information to the sequence control circuitry 120 and receive magnetic resonance data from the sequence control circuitry 120. Furthermore, the processing circuitry 150 which has the interface function 150a receives magnetic resonance data and then stores the received magnetic resonance data in the memory 132. The magnetic resonance data stored in the memory 132 is allocated in the k-space by the control function 150c. As a result, the memory 132 stores k-space data.

The memory 132 stores magnetic resonance data received by the processing circuitry 150 which has the interface function 150a, k-space data allocated in the k-space by the processing circuitry 150 which has the control function 150c, image data generated by the processing circuitry 150 which has the generation function 150d and the like. For example, the memory 132 is a semiconductor memory device, such as a random access memory (RAM) or a flash memory, a hard disk, or an optical disk.

The input interface 134 receives various commands or information input from an operator. The input interface 134 is, for example, a pointing device such as a mouse or a trackball, a selecting device such as a mode change switch, or an input device such as a keyboard. Under the control of the processing circuitry 150 which has the control function 150c, the display 135 presents a graphical user interface (GUI) for receiving input of an imaging condition, images generated by the processing circuitry 150 which has the generation function 150d, or the like. The display 135 is, for example, a display device such as a liquid crystal display device.

The processing circuitry 150 uses the control function 150c to perform the overall control on the magnetic resonance imaging apparatus 100 so as to control capturing or generation of images, display of images, or the like. For example, the processing circuitry 150 uses the control function 150c to present images on the display 135. Furthermore, the processing circuitry 150 uses the control function 150c to receive operations from a user. As described later, examples of the operation received from a user include an operation to select an image from multiple images, an operation to select the region of interest (ROI), or the like.

Furthermore, the processing circuitry 150 uses the control function 150c to receive input of an imaging condition (imaging parameter, or the like) via the GUI, generate sequence information based on the received imaging condition, and transmits the generated sequence information to the sequence control circuitry 120.

The processing circuitry 150 uses the calculation function 150b to calculate the value of a TE in the second pulse sequence which is executed subsequent to the first pulse sequence, on the basis of the data acquired in the first pulse sequence. This process is explained later in detail.

The processing circuitry 150 uses the generation function 150d to execute a reconstruction process, such as Fourier transform, on the k-space data acquired from the sequence control circuitry 120, thereby generating an image. Furthermore, the processing circuitry 150 uses the generation function 150d to perform a subtraction operation or the like which is described below, on the data obtained in the second pulse sequence, thereby generating an image.

Next, the background related to the embodiment is briefly explained.

For magnetic resonance imaging, according to an imaging technique such as the ultrashort echo time (UTE) imaging technique, it is possible to depict tissues with a short $T_2^*$ value, which is a $T_2$ value in consideration of inhomogeneity of a magnetic field. This makes it possible to depict tissues such as cartilages or joints, which are difficult to depict according to conventional techniques.

As a possible method for depicting tissues with a short $T_2^*$ value, there is a method for executing subtraction between an image acquired in a small TE and an image acquired in a large TE.

However, as each site or tissue which is the target to be imaged has a different $T_2^*$ value, it is sometimes difficult to determine in advance in which TEs the images are optimally acquired to perform subtraction between them.

Figure 4:
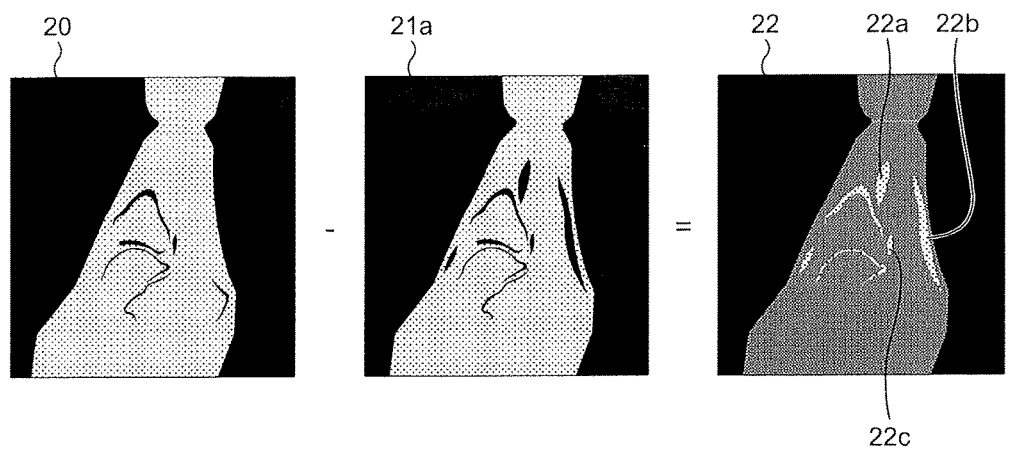
FIG. 4 is a diagram that illustrates the background related to the first embodiment.
Figure 5:
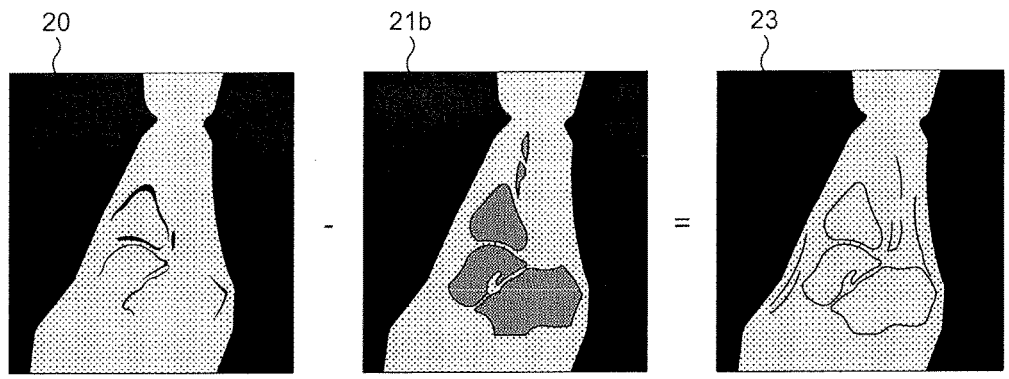
FIG. 5 is a diagram that illustrates the background related to the first embodiment.

FIGS. 4 and 5 illustrate such a situation. FIGS. 4 and 5 are diagrams that illustrate the background related to the first embodiment.

In FIG. 4, an image 20 represents an image in a case where the TE is short. The image 20 is an image with, for example, TE=0.1 ms. The image 20 includes the information of $T_2^*$ on a tissue. An image 21a is an image with, for example, TE=2.0 ms. An image 22 represents a subtraction image between the image 20 and the image 21a. The $T_2^*$ component does not relax on the image 20, while the $T_2^*$ component relaxes on the image 21a; therefore, a subtraction image between them is generated so that tissues with a short $T_2^*$ component, such as tissues 22a, 22b, and 22c, may be rendered on the image 22 in a highlighted manner. That is, the image 21a is an image in a case where the value of the TE is appropriate when generating a subtraction image.

On the other hand, in FIG. 5, the image 20 represents an image in a case where the TE is short, as is the case with FIG. 4. An image 21b represents an image with, for example, TE=4.6 ms. An image 23 represents a subtraction image between the image 20 and the image 21b. Other relaxation effects such as $T_2$ component appear on the image 21b aside from the $T_2^*$ component; therefore, if a subtraction image between the image 20 and the image 21b is generated, relaxation effects other than the $T_2^*$ component appear on the subtraction image. As a result, the desired tissues are not sufficiently highlighted in some cases. That is, the image 21b is an image in a case where the value of the TE of the target image from which a subtraction image is generated is longer than an appropriate value.

Furthermore, if the value of the TE of the target image from which a subtraction image is generated is shorter than an appropriate value, the $T_2^*$ component does not relax on either image; therefore, if a subtraction image between them is generated, the effect of the $T_2^*$ component does not appear on the subtraction image. As a result, the desired tissues are not sufficiently highlighted in some cases.

In view of the above background, in the magnetic resonance imaging apparatus 100 according to the first embodiment, the sequence control circuitry 120 executes the first pulse sequence which is a pulse sequence of the ultrashort echo time (UTE) imaging technique and is a multi-echo pulse sequence, to acquire multiple sets of data with different TEs. Then, the processing circuitry 150 uses the calculation function 150b to calculate the value of the TE in the second pulse sequence on the basis of images with different TEs generated based on the acquired sets of data.

Figure 6:
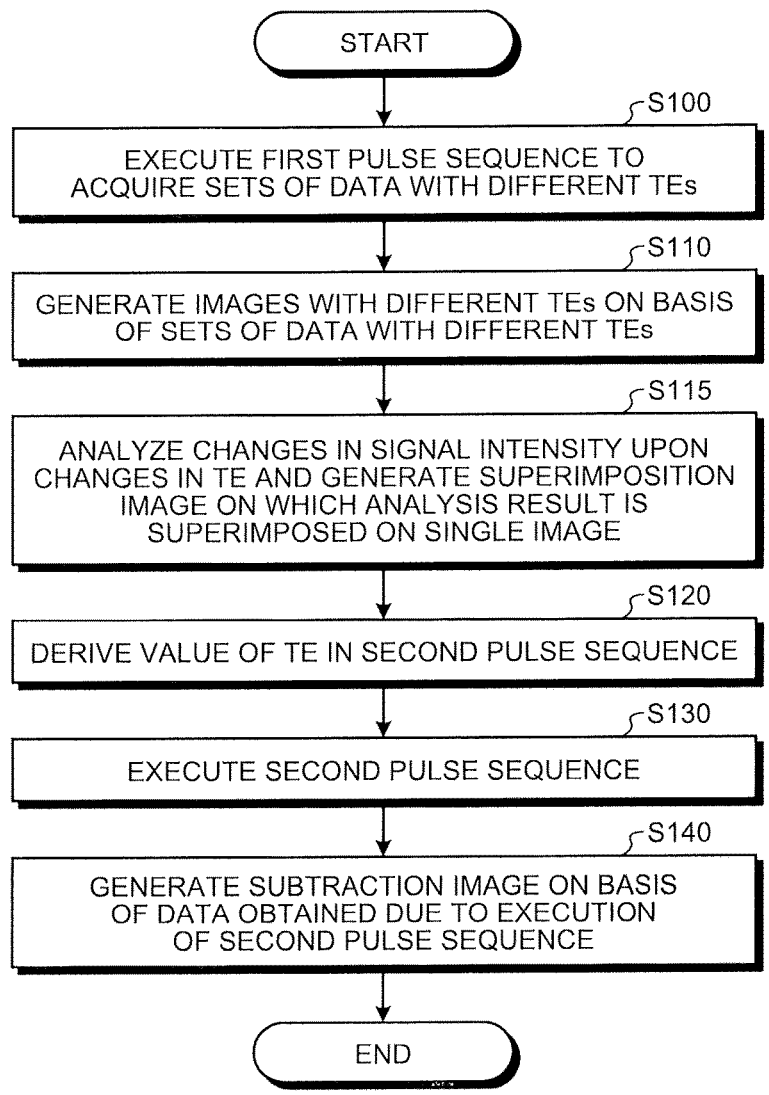
FIG. 6 is a flowchart that illustrates the flow of a process performed by the magnetic resonance imaging apparatus according to the first embodiment.
Figure 7:
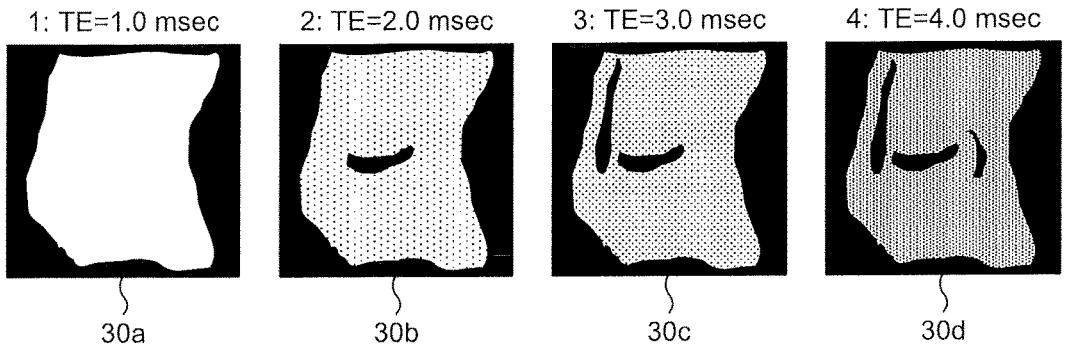
FIG. 7 is an example of the image generated by the magnetic resonance imaging apparatus according to the first embodiment.

This configuration is explained with reference to FIGS. 6 to 8. FIG. 6 is a flowchart that illustrates the flow of a process performed by the magnetic resonance imaging apparatus according to the first embodiment. FIGS. 7 and 8 are examples of the image generated by the magnetic resonance imaging apparatus 100 according to the first embodiment and the screen displayed by the magnetic resonance imaging apparatus 100.

First, at Step S100, the sequence control circuitry 120 executes the first pulse sequence which is a pulse sequence of the UTE imaging technique and is a multi-echo pulse sequence, to acquire multiple sets of data with different TEs. For example, the sequence control circuitry 120 executes the pulse sequence illustrated in FIG. 2 as the first pulse sequence, to acquire multiple sets of data with different TEs during the data acquisition period 12a and the data acquisition period 12c or during the data acquisition period 12b and the data acquisition period 12d. Furthermore, according to another example, the sequence control circuitry 120 executes the pulse sequence with flyback illustrated in FIG. 3, as the first pulse sequence, to acquire multiple sets of data with different TEs during the data acquisition period 13a and the data acquisition period 13b.

As described above, high-resolution images do not need to be generated during the first pulse sequence, contrary to the second pulse sequence for generating images used for clinical diagnosis; therefore, the resolution of acquired image data may be reduced by decreasing an acquisition density in the k-space, or the like, so that conditions are specified such that, for example, scan is completed in about several tens of seconds.

Furthermore, the sequence control circuitry 120 acquires the sets of data with different TEs at a timing such that a water signal and a fat signal are in the identical phase (in-phase) during the first pulse sequence.

The reason why the sequence control circuitry 120 executes acquisition at a timing such that a water signal and a fat signal are in the identical phase (in-phase) is as follows.

Specifically, if the image used as the target from which a subtraction image is generated is acquired at a timing such that a water signal and a fat signal are in the opposite phase (out-phase), the subtraction image has two types of differences mixed, i.e., the difference in the signals between different TEs and the difference between the water signal and the fat signal. Here, it is difficult to quantitatively analyze the two types of differences, and contribution of the difference between the water signal and the fat signal interferes with recognition of the difference in the signals between different TEs; therefore, it is preferable that the water signal and the fat signal are in the identical phase (in-phase). Therefore, in the second pulse sequence which is the subject imaging, it is preferable that sets of data related to two target images from which a subtraction image is generated be acquired at a timing such that a water signal and a fat signal are in the identical phase (in-phase) rather than a timing such that a water signal and a fat signal are in the opposite phase (out-phase). Therefore, in the first pulse sequence for determining the TE for the second pulse sequence, too, the sequence control circuitry 120 acquires multiple sets of data with different TEs at a timing such that a water signal and a fat signal are in the identical phase (in-phase).

Furthermore, as the resonant frequency of water and the resonant frequency of fat are already known, the time when a water signal and a fat signal are in the identical phase (in-phase) may be derived by predetermined calculation. Based on the time that is previously derived by the predetermined calculation, the sequence control circuitry 120 adjusts the timing of executing data acquisition.

Next, at Step S110, the processing circuitry 150 uses the calculation function 150b to generate multiple images with different TEs on the basis of the sets of data with different TEs. The processing circuitry 150 may use the control function 150c to present the generated images with different TEs on the display 135.

Next, at Step S115, the processing circuitry 150 uses the calculation function 150b to analyze signal changes when changing TEs on the basis of the images generated at Step S110. For example, the processing circuitry 150 uses the calculation function 150b to analyze changes in the signal intensity when changing the TEs on the basis of the images generated at Step S110 and generate a superimposition image on which an analysis result of the analysis is superimposed on a single image. An example of the superimposition image is illustrated in FIG. 8. FIG. 8 is an example of the screen displayed by the magnetic resonance imaging apparatus 100 according to the first embodiment. Furthermore, FIG. 7 illustrates intermediate images to generate the superimposition image. FIG. 7 is an example of the image generated by the magnetic resonance imaging apparatus according to the first embodiment.

In FIG. 7, an image 30a, an image 30b, an image 30c, and an image 30d represent intermediate images from which the processing circuitry 150 generates a superimposition image by using the calculation function 150b. The images 30a to 30d are generated from the images with different TEs, respectively, which are generated at Step S110. In the example of FIG. 7, the image 30a is generated from the image with TE=1.0 ms among the images with different TEs generated at Step S110. The image 30b is generated from the image with TE=2.0 ms among the images with different TEs generated at Step S110. Furthermore, the image 30c and the image 30d are images generated from the images with TE=3.0 ms and TE=4.0 ms, respectively.

First, the method for generating the images 30a to 30d is explained. With regard to each of the images generated at Step S110, the processing circuitry 150 uses the calculation function 150*b* to specify a region where its signal value exceeds a predetermined threshold (the region that gives a signal) and the region (the region that does not give a signal) other than the region where its signal value exceeds the predetermined threshold. For example, the predetermined threshold may be determined to be a predetermined percentage with respect to the maximum signal value in each image, or the predetermined threshold may be the same value for multiple images with different TEs. Then, the processing circuitry 150 uses the calculation function 150*b* to paint the region where its signal value exceeds the predetermined threshold, with the color that corresponds to the TE of the image. Conversely, the region where its signal value is less than the predetermined threshold is not painted.

For example, the processing circuitry 150 uses the calculation function 150*b* to generate the image 30*a* from the image with the shortest TE (the image with TE=1.0 ms) among the images with different TEs generated at Step S110. Specifically, the processing circuitry 150 uses the calculation function 150*b* to prevent the region where its signal value is less than the predetermined threshold from being painted (displayed in black). Conversely, the processing circuitry 150 uses the calculation function 150*b* to paint the region where its signal value exceeds the predetermined threshold. The processing circuitry 150 uses the calculation function 150*b* to paint the region where its signal value exceeds the predetermined threshold, by using the color "white" that corresponds to the TE of the image 30*a*. In this way, the processing circuitry 150 uses the calculation function 150*b* to generate the image 30*a*, which is an image where the region in which its signal value exceeds the predetermined threshold is painted by using the color "white" that corresponds to the TE of the image 30*a* and the region in which its signal value does not exceed the predetermined threshold is not painted.

Furthermore, for example, the processing circuitry 150 uses the calculation function 150*b* to generate the image 30*b* from the image with the second shortest TE (the image with TE=2.0 ms) among the images with different TEs generated at Step S110. Specifically, the processing circuitry 150 uses the calculation function 150*b* to prevent the region where its signal value is less than the predetermined threshold from being painted (displayed in black). Conversely, the processing circuitry 150 uses the calculation function 150*b* to paint the region where its signal value exceeds the predetermined threshold. The processing circuitry 150 uses the calculation function 150*b* to paint the region where its signal value exceeds the predetermined threshold by using the color "light gray" that is a color corresponding to the TE of the image 30*b*. In this way, the processing circuitry 150 uses the calculation function 150*b* to generate the image 30*b*, which is an image in which the region where its signal value exceeds the predetermined threshold is painted by using the color "light gray" that is a color corresponding to the TE of the image 30*b* and the region where its signal value does not exceed the predetermined threshold is not painted.

In the same manner, the processing circuitry 150 uses the calculation function 150*b* to generate the image 30*c* from the image with the third shortest TE (the image with TE=3.0 ms) among the images with different TEs generated at Step S110. The processing circuitry 150 uses the calculation function 150*b* to generate the image 30*c*, which is an image in which the region where its signal value exceeds the predetermined threshold is painted by using the color "gray" that is a color corresponding to the TE of the image 30*c* and the region where its signal value does not exceed the predetermined threshold is not painted.

In the same manner, the processing circuitry 150 uses the calculation function 150*b* to generate the image 30*d* from the image with the fourth shortest TE (the image with TE=4.0 ms) among the images with different TEs generated at Step S110. The processing circuitry 150 uses the calculation function 150*b* to generate the image 30*d*, which is an image in which the region where its signal value exceeds the predetermined threshold is painted by using the color "dark gray" that is a color corresponding to the TE of the image 30*d* and the region where its signal value does not exceed the predetermined threshold is not painted.

Then, the processing circuitry 150 uses the calculation function 150*b* to superimpose intermediate images which are generated for the respective TEs, so as to generate a superimposition image. An example of the superimposition image is illustrated in FIG. 8. A superimposition image 31 is an example of the superimposition image generated by the processing circuitry 150 using the calculation function 150*b* at Step S115. The processing circuitry 150 uses the calculation function 150*b* to superimpose the images 30*a* to 30*d* so as to generate the superimposition image 31.

Here, the processing circuitry 150 uses the calculation function 150*b* to generate the superimposition image 31 by using the color that corresponds to the TE of the intermediate image that corresponds to the longest TE, among the intermediate images painted for each point. For example, a site 31*a* in FIG. 8 is painted on the image 30*a* in FIG. 7, and it is not painted on the image 30*b*, the image 30*c*, or the image 30*d*. Therefore, among the painted intermediate images, the intermediate image that corresponds to the longest TE is the image 30*a*. Therefore, the site 31*a* is painted by using the color "white" that is a color corresponding to the TE of the image 30*a*. Furthermore, a site 31*b* in FIG. 8 is painted on the image 30*a* and the image 30*b* in FIG. 7, and it is not painted on the image 30*c* or the image 30*d*. Therefore, among the painted intermediate images, the intermediate image that corresponds to the longest TE is the image 30*b*. Therefore, the site 31*b* is painted by using the color "light gray" that is a color corresponding to the TE of the image 30*b*. Furthermore, a site 31*c* in FIG. 8 is painted on the image 30*a*, the image 30*b*, and the image 30*c* in FIG. 7, and it is not painted on the image 30*d*. Therefore, among the painted intermediate images, the intermediate image that corresponds to the longest TE is the image 30*c*. Therefore, the site 31*c* is painted by using the color "gray" that is a color corresponding to the TE of the image 30*c*. Moreover, on the superimposition image 31, other sites that contain data are painted by using "dark gray".

Furthermore, the processing circuitry 150 uses the control function 150*c* to present images such as the superimposition image generated as described above on the display 135.

Then, the processing circuitry 150 uses the control function 150*c* to receive operations from the user. For example, the processing circuitry 150 uses the control function 150*c* to receive inputs from the user by using the GUI that is illustrated in FIG. 8. A panel 40 is a panel for receiving, from a user, an operation related to a long TE among the TEs used for a subtraction image in the second pulse sequence that is subsequently executed. $TE_2$ in FIG. 8 represents the TE. Furthermore, a short TE among the TEs used for a subtraction image in the second pulse sequence that is subsequently executed is set to, for example, a fixed value. The processing circuitry 150 uses the control function 150*c* to present the message, for example, "please select the TE used as $TE_2$" on the panel 40 of the display 135. Furthermore, the processing circuitry 150 receives an operation related to a long TE ($TE_2$) among the TEs that are related to the subsequently executed second pulse sequence and that are used for a subtraction image. A button 40a, a button 40b, a button 40c, and a button 40d are buttons for receiving operations from a user with regard to the value of the TE in the second pulse sequence. On the basis of the information on the superimposition image 31 presented on the display 135, a user determines the optimum TE in the second pulse sequence. If the user selects any of the button 40a, the button 40b, the button 40c, and the button 40d on the basis of the determination made based on the information on the superimposition image 31, the processing circuitry 150 uses the control function 150c to receive, as the value of the TE, the value of the TE that corresponds to the button selected by the user.

Next, at Step S120, the processing circuitry 150 which includes the calculation function 150b derives the value of the TE in the second pulse sequence, that is, for example the first TE ($TE_1$) or the second TE ($TE_2$), based on the operation received from the user on the basis of the above-described image that is presented on the display 135 by the control function 150c. For example, the processing circuitry 150 derives the value of the TE selected by the user through the button 40b in FIG. 8, as the long TE ($TE_2$) among the TEs that are related to the second pulse sequence and that are used for a subtraction image. Similarly, the processing circuitry 150 derives the value of the TE chosen by the user with a button not illustrated in FIG. 8, as the shorter of the TEs ($TE_1$) out of the TEs that correspond to the second pulse sequence and that are used for the subtraction image. In this manner, the processing circuitry 150 uses the calculation function 150b to analyze changes in the signal intensity when changing the TEs on the basis of the images generated at Step S110 and derives the value of the TE in the second pulse sequence based on an analysis result.

Then, at Step S130, the sequence control circuitry 120 executes the second pulse sequence based on the value of the TE calculated by the calculation function 150b at Step S120 and acquires multiple sets of data with different TEs. Examples of the second pulse sequence include the sequence that is the same as the first pulse sequence as illustrated in FIG. 2 or 3 or a sequence that is different from the first pulse sequence. Typically, during the second pulse sequence, imaging is executed under imaging conditions such that high-resolution image data is obtained, as compared to the first pulse sequence.

Furthermore, at Step S130, the sequence control circuitry 120 typically acquires multiple sets of data with different TEs at a timing such that a water signal and a fat signal are in the identical phase (in-phase).

Then, at Step S140, the processing circuitry 150 which includes the generation function 150d performs a process that includes a subtraction operation which is an operation to perform subtraction between two sets of data on predetermined data among the sets of data with different TEs calculated by the calculation function 150b, thereby generating a subtraction image. For example, at Step S130, the sequence control circuitry 120 executes the second pulse sequence by using two TEs, i.e., the TE ($TE_1$) that is a first length and the TE ($TE_2$) that is a second length, to acquire two sets of data, i.e., the data that has $TE_1$ as the length of the TE and the data that has $TE_2$ as the length of the TE. Typically, $TE_1$ is a TE that is the short time where relaxation of $T_2^*$ of the tissue has not occurred yet, $TE_2$ is a TE that is the time where relaxation of $T_2^*$ of the tissue has occurred but relaxation of the others have not occurred, and it is the TE derived at Step S120. At Step S140, the processing circuitry 150 uses the generation function 150d to perform a subtraction operation on the image obtained from the data that has $TE_1$ as the length of the TE (data corresponding to the first TE) and the image obtained from the data that has $TE_2$ as the length of the TE (data corresponding to the second TE), thereby generating a subtraction image.

Furthermore, if needed, the processing circuitry 150 uses the control function 150c to present the subtraction image generated at Step S140 on the display 135.

Moreover, embodiments are not limited to this situation.

For example, in the above-described embodiment, an explanation is given of a case where the processing circuitry 150 uses the control function 150c to present the superimposition image generated at Step S115 on the display 135; however, this is not a limitation on the embodiment. The processing circuitry 150 may use the control function 150c to present multiple images with different TEs generated at Step S110 on the display 135 instead of the superimposition image 31 and receive an operation from the user. In such a case, at Step S120, the processing circuitry 150 uses the control function 150c to derive the value of the TE in the second pulse sequence based on the operation received from the user.

FIG. 9 illustrates an example of the above situation. At Step S115, the processing circuitry 150 uses the control function 150c to present the images 30a to 30d on the display 135 instead of the superimposition image 31. From the user who views the images 30a to 30d presented on the display 135, the processing circuitry 150 receives an input of the TE in the second pulse sequence as a form of selecting any one of the presented images. In other words, the processing circuitry 150 uses the control function 150c to receive an operation to select any one of the images 30a to 30d presented on the display 135. For example, in FIG. 9, if the user selects the button 40b that is related to the image 30b, the processing circuitry 150 uses the calculation function 150b to derive the value of the TE which is related to the image 30b selected by the user as the value of the TE in the second pulse sequence at Step S120.

Furthermore, the processing circuitry 150 may use the control function 150c to present the very images with different TEs generated at Step S110 on the display 135 instead of the images 30a to 30d that are intermediate images.

Furthermore, this is not a limitation on the embodiment. In the first embodiment, an explanation is given of a case where feedback is received from a user when the processing circuitry 150 uses the calculation function 150b to derive the value of the TE in the second pulse sequence. This is not a limitation on the embodiment. At Step S120, the processing circuitry 150 which includes the calculation function 150b may automatically calculate and derive the value of the TE in the second pulse sequence based on multiple images with different TEs that are generated on the basis of multiple sets of data with different TEs. According to an example of the above process, based on the region of interest (ROI) or the body part to be imaged that is previously set before the first pulse sequence is executed, the processing circuitry 150 may use the calculation function 150b to analyze changes in the average signal intensity within the region of interest or the body part to be imaged depending on the value of TE and derive the value of the TE in the second pulse sequence based on an analysis result.

It is noted that in a case in which information regarding the region of interest or the body part to be imaged is known, that is, a case in which the information is known because the information is preset in advance, or a case in which an input from the user is received prior to the execution of the first pulse sequence, the sequence control circuitry 120 need not execute the first pulse sequence. In such a case, the processing circuitry 150 directly derive, by the calculating function 150b, the value of the TE in the second pulse sequence based on the information regarding the region of interest or the body part to be imaged.

Furthermore, as another example, the sequence control circuitry 120 may execute the first pulse sequence in one case and need not execute the first pulse sequence in another case. For example, in a case in which information regarding at least one of the region of interest, the body part to be imaged and the like is known prior to the timing in which the sequence control circuitry 120 normally executes the first pulse sequence, that is, for example, a case in which an input of information regarding the region of interest or the body part to be imaged is received from the user prior to the execution of the first pulse sequence, the sequence control circuitry 120 does not execute the first pulse sequence. In such a case, the processing circuitry 150 directly derives the value of the TE in the second pulse sequence, not by using the first pulse sequence but based on information regarding at least one of the region of interest and the body part to be imaged. On the other hand, in a case in which information regarding at least one of the region of interest and the body part to be imaged is not known at the timing in which the sequence control circuitry 120 normally executes the first pulse sequence, that is, for example, a case in which no input of information regarding the region of interest, the body part to be imaged and the like is received from the user prior to the execution of the first pulse sequence, the sequence control circuitry 120 does execute the first pulse sequence. In such a case, by the calculating function 150b, the processing circuitry 150 derives the value of the TE in the second pulse sequence based on the multiple data acquired by the first pulse sequence executed by the sequence control circuitry 120.

Figure 10:
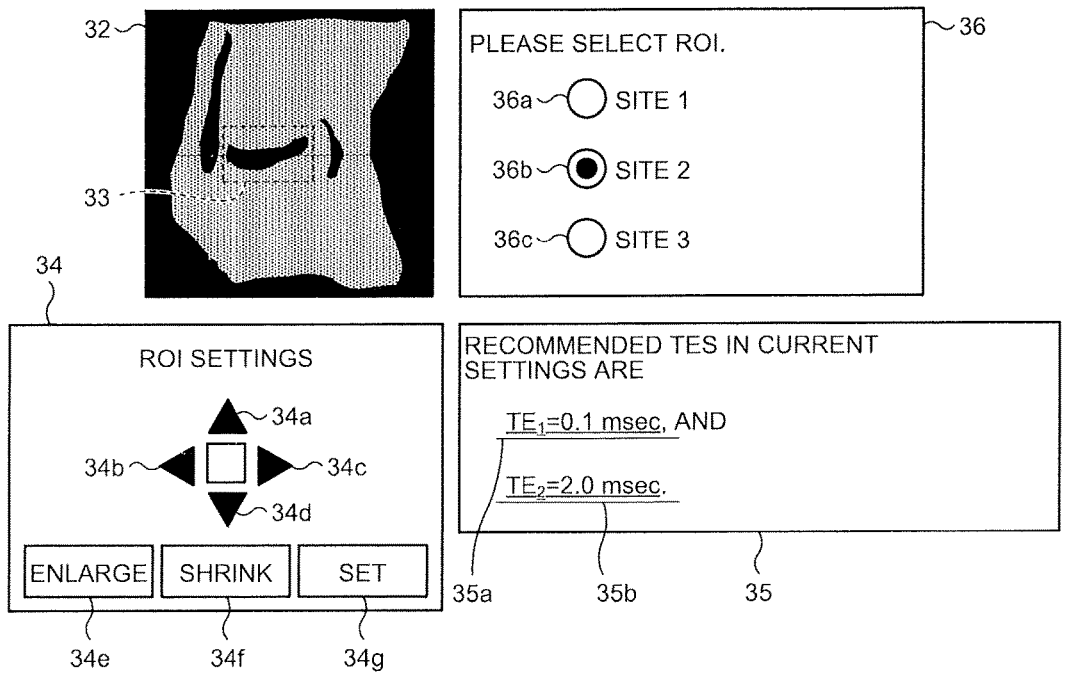
FIG. 10 is an example of the screen that is displayed by the magnetic resonance imaging apparatus according to the first embodiment.

Furthermore, the region of interest or the body part to be imaged does not need to be previously set before the first pulse sequence is executed, and it may be set when an input is received from a user after the first pulse sequence is executed. An example of the user interface is illustrated in FIG. 10. FIG. 10 illustrates an example of the screen that is displayed by the magnetic resonance imaging apparatus according to the first embodiment.

A display screen 32 is a screen that displays the region of interest (ROI), and the display screen 32 presents the superimposition image 31, any of the images 30a to 30d, or the like. A region of interest 33 represents the region of interest in the current settings. A setting panel 34 and a setting panel 36 are panels for setting the region of interest, and a display panel 35 is a display panel for displaying the derived value of the TE in the second pulse sequence for users.

At Step S115, the processing circuitry 150 uses the control function 150c to receive an operation to select the region of interest 33.

For example, the processing circuitry 150 uses the control function 150c to receive an operation to select the region of interest 33 through the setting panel 34. A user may move the region of interest 33 to the left, right, top, or bottom through a button 34a, a button 34b, a button 34c, a button 34d, or the like, and enlarge and shrink the region of interest 33 through a button 34e and a button 34f. Furthermore, a user may confirm the region of interest 33 through a button 34g.

Furthermore, according to another example, the combination of a predetermined site for the subject imaging and the region of interest which is suitable for observation of the predetermined site may be previously set so that a user selects the site which is observed during the subject imaging and the processing circuitry 150 receives an operation to select the region of interest 33. For example, the processing circuitry 150 uses the control function 150c to receive an operation to select the region of interest 33 through the setting panel 36. The user selects the site which is the target to be imaged during the subject imaging through a button 36a, a button 36b, and a button 36c, so as to select the previously set region of interest as the region of interest 33 for the site. For example, if the user selects the button 36b, the processing circuitry 150 uses the control function 150c to set the region of interest related to the site that corresponds to the button 36b as the region of interest 33.

After the processing circuitry 150 uses the control function 150c to receive an operation to select the region of interest 33, the processing circuitry 150 uses the calculation function 150b to derive the value of a TE in the second pulse sequence on the basis of the region of interest 33 selected by the user at Step S120. For example, the processing circuitry 150 uses the calculation function 150b to derive the values of TEs in the second pulse sequence such that a short TE among the TEs that are the targets from which a subtraction image is obtained, is $TE_1=0.1$ ms and a long TE among the TEs that are the targets from which a subtraction image is obtained, is $TE_2=2.0$ msec. For example, the processing circuitry 150 sets the value of $TE_1$ to a fixed value and derives the value of $TE_2$ based on changes in the signal intensity when changing TEs on the region of interest 33 selected by the user. For example, the processing circuitry 150 uses the calculation function 150b to derive, as the value of $TE_2$, the TE in which the average signal intensity first falls below the predetermined threshold on the region of interest 33 selected by the user. Furthermore, embodiments are not limited to this situation, and the processing circuitry 150 may derive both the value of $TE_1$ and the value of $TE_2$ based on changes in the signal intensity when changing the TEs on the region of interest 33 selected by the user.

Furthermore, the processing circuitry 150 uses the control function 150c to present the derived value of the TE through the display panel 35. For example, the processing circuitry 150 presents the value of $TE_1$ on a display area 35a and the value of $TE_2$ on a display area 35b.

Furthermore, if needed, the processing circuitry 150 uses the control function 150c to receive an operation to reselect (rechange) the region of interest 33 from the user who views the display panel 35. After reselection of the region of interest 33 is received from the user, the processing circuitry 150 uses the calculation function 150b to re-derive the value of the TE in the second pulse sequence and uses the control function 150c to present a result of re-derivation on the display panel 35.

Then, if the user accepts the value of the TE in the second pulse sequence derived by the calculation function 150b, by using an undepicted button, the sequence control circuitry 120 executes the second pulse sequence at Step S130 and afterward performs the same process.

Furthermore, embodiments are not limited to the above-described example. Although an explanation is given of a case where a subtraction operation is performed between two images at Step S140 in FIG. 6, embodiments are not limited to this situation.

For example, at Step S140, the process including a subtraction operation may be performed between three or more images to generate an image. For example, at Step S130, the sequence control circuitry 120 executes the second pulse sequence with three types of TEs, i.e., $TE=TE_1$, $TE_2$, and $TE_3$. At Step S140, the processing circuitry 150 may use the generation function 150d to generate an image that includes the subtraction operation by using, for example, the operation of $2X_1-X_2-X_3$, where the image obtained from the data of $TE=TE_1$ is $X_1$, the image obtained from the data of $TE=TE_2$ is $X_2$, and the image obtained from the data of $TE=TE_3$ is $X_3$.

In this manner, according to the first embodiment, the sequence control circuitry 120 executes the first pulse sequence which is a pulse sequence of the UTE imaging technique and is a multi-echo pulse sequence, to acquire multiple sets of data with different TEs. The processing circuitry 150 uses the calculation function 150b to generate the superimposition image 31 on the basis of the sets of data with different TEs. On the basis of it, the processing circuitry 150 derives the value of the TE in the second pulse sequence to generate an image for clinical use. Thus, an appropriate TE may be derived during the pulse sequence for generating an image for clinical use, and tissues with a short $T_2^*$ value may be properly depicted.

Second Embodiment

In the first embodiment, an explanation is given of a case where the sequence control circuitry 120 executes two pulse sequences, i.e., the first pulse sequence for deriving the value of a TE in the second pulse sequence to generate an image for clinical use and the second pulse sequence for generating the image for clinical use. In a second embodiment, an explanation is given of a case where the sequence control circuitry 120 executes the pulse sequence for generating an image for clinical use.

In such a case, as already explained in the first embodiment, if the image from which a subtraction image is generated is acquired at a timing such that a water signal and a fat signal are in the opposite phase (out-phase), the subtraction image includes the difference in the signals between different TEs and the difference between the water signal and the fat signal. Here, contribution of the difference between the water signal and the fat signal is harmful in focusing on the difference in the signals between different TEs; therefore, it is preferable the water signal and the fat signal are in the identical phase (in-phase). Therefore, if only the pulse sequence for generating an image for clinical use is executed, the sequence control circuitry 120 executes acquisition at a timing such that a water signal and a fat signal are in the identical phase (in-phase).

In other words, according to the second embodiment, the sequence control circuitry 120 uses a pulse sequence of the UTE imaging technique to acquire multiple sets of data with different echo times (TEs) at a timing such that a water signal and a fat signal are in the identical phase. The processing circuitry 150 uses the generation function 150d to perform a process that includes a subtraction operation which is an operation to perform subtraction between two sets of data, on predetermined data among the acquired sets of data, thereby generating an image.

Figure 11:
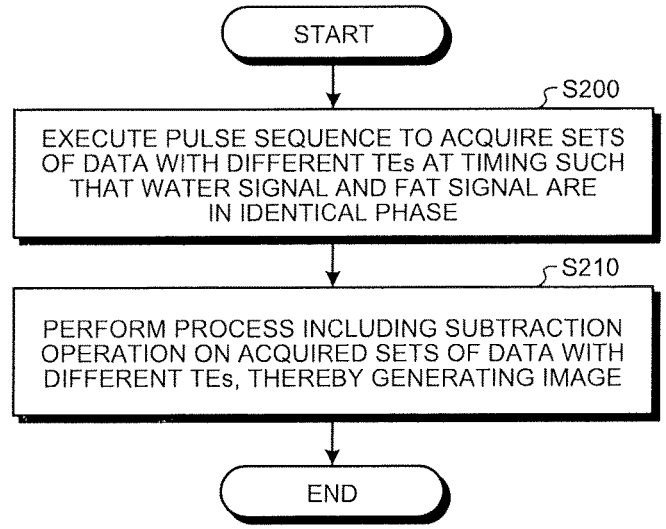
FIG. 11 is a flowchart that illustrates the flow of the process performed by the magnetic resonance imaging apparatus according to a second embodiment.

An example of the above process is illustrated in FIG. 11. FIG. 11 is a flowchart that illustrates the flow of the process performed by the magnetic resonance imaging apparatus according to the second embodiment. Here, detailed explanations are omitted for the process and the part that are the same as those in the first embodiment.

At Step S200, the sequence control circuitry 120 executes a pulse sequence of the UTE imaging technique to acquire multiple sets of data with different TEs at a timing such that a water signal and a fat signal are in the identical phase. Here, the executed pulse sequence is, for example, a pulse sequence for generating multi-echo, and it is, for example, the pulse sequence illustrated in FIG. 2 or 3. Furthermore, as the resonant frequency of water signals and the resonant frequency of fat signals are already known, the time when a water signal and a fat signal are in the identical phase may be calculated by using a predetermined method before the pulse sequence is executed. The sequence control circuitry 120 acquires multiple sets of data with different TEs at a predetermined time based on a calculation result.

Then, the processing circuitry 150 uses the calculation function 150b to derive the target data with which a subtraction operation is performed during the process described later. Specifically, the processing circuitry 150 uses the calculation function 150b to determine, among multiple sets of data with different TEs, which TE data is used to generate an image. As described in the first embodiment, the determination process may be performed such that an image like the superimposition image 31 in FIG. 8 is generated and an input of the TE is received from the user, or it may be performed such that images are generated as in FIG. 9 and an input of the TE is received from the user. Furthermore, according to another example, as described in the first embodiment, the determination process may be automatically set on the basis of the previously set region of interest, or the like, or it may be automatically performed on the basis of the received region of interest after designation of the region of interest is received from a user as in FIG. 10.

Then, at Step S210, the processing circuitry 150 uses the generation function 150d to perform the process including the subtraction operation on the acquired sets of data with different TEs, thereby generating an image. Typically, the processing circuitry 150 uses the generation function 150d to perform the subtraction operation on two sets of data which are derived by the calculation function 150b as the target data with which the subtraction operation is performed at the above-described step among the acquired sets of data with different TEs, thereby generating an image.

In this manner, according to the second embodiment, multiple sets of data with different TEs are acquired at a timing such that a water signal and a fat signal are in the identical phase, and predetermined data among them becomes the target for a subtraction operation; therefore, even if a pulse sequence is executed once, a tissue with a short $T_2^*$ value may be accurately depicted.

Program

Furthermore, the commands specified in the procedures described in the above embodiment may be executed based on software programs. A general-purpose computer previously stores the program and reads the program so as to obtain the same advantage as that of the magnetic resonance imaging apparatus 100 according to the above-described embodiment. The commands described in the above embodiment are recorded in a magnetic disk (flexible disk, hard disk, or the like), an optical disk (CD-ROM, CD-R, CD-RW, DVD-ROM, DVD±R, DVD±RW, or the like), a semiconductor memory, or a similar recording medium as a program executable by a computer. A storage medium may have any storage format as long as it is readable by a computer or an installed system. The computer reads the program from the recording medium and, based on the program, causes the CPU to execute the command specified in the program so as to perform the same operation as that of the magnetic resonance imaging apparatus 100 according to the above-described embodiment. Furthermore, if the computer acquires or reads the program, it may be acquired or read via a network.

Furthermore, part of each process for implementing the above-described embodiment may be performed by the operating system (OS), which operates on the computer based on commands of the program installed from the storage medium to the computer or the installed system, middleware (MW) for database management software or networks, or the like. Furthermore, the storage medium includes not only media that are separate from the computer or the installed system, but also storage media that download programs, transmitted via a local area network (LAN), the Internet, or the like, and store or temporarily store them. Furthermore, the number of storage media is not limited to one, and the storage medium according to the embodiment includes a case where a process according to the above-described embodiment is performed by multiple media; the medium have any configuration.

Furthermore, the computer or the installed system according to the embodiment performs each process in the above-described embodiment based on programs stored in the storage medium, and it may have any configuration, e.g., a single apparatus, such as a personal computer or a microcomputer, or a system with apparatuses connected via a network. Furthermore, the computer according to the embodiment includes not only a personal computer but also an arithmetic processing device, a microcomputer, or the like included in an information processing apparatus, and it is a collective term for devices or apparatuses that may perform functions according to the embodiment by using programs.

Further, in the magnetic resonance imaging apparatus 100 according to the embodiments, the portion that is other than the sequence control circuitry 120 (e.g. the image processing apparatus 130) need not be installed on the premises along with the magnetic resonance imaging apparatus 100. An imaging processing apparatus or a signal processing apparatus other than the magnetic resonance imaging apparatus may execute the similar processing as the image processing apparatus 130. Such other imaging processing apparatus or signal processing apparatus may comprise the similar function as the image processing apparatus 130. Furthermore, as the computational resource the image processing apparatus or the signal processing apparatus uses, for example, cloud-computing technology may be used.

As described above, according to at least one of the embodiments, it is possible to provide a magnetic resonance imaging apparatus that may depict tissues with a short $T_2^*$ value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    sequence control circuitry configured to execute a first pulse sequence to acquire multiple sets of data with different echo times (TEs), the first pulse sequence being a pulse sequence of an ultrashort echo time (UTE) imaging technique and being a multi-echo pulse sequence; and
    processing circuitry configured to derive a value of a TE (Echo Time) in a second pulse sequence executed by the sequence control circuitry based on the multiple sets of data.

2. The magnetic resonance imaging apparatus according to claim 1, wherein the processing circuitry is configured to derive a first TE and a second TE that are used in the second pulse sequence and perform a subtraction operation between data corresponding to the first TE and data corresponding to the second TE, thereby generating a subtraction image.

3. The magnetic resonance imaging apparatus according to claim 1, wherein the UTE imaging technique is an imaging technique acquiring data of short TE (Echo Time) by radial acquisition.

4. The magnetic resonance imaging apparatus according to claim 1, wherein the processing circuitry is configured to
    cause a display to present an image
    receive an operation from a user, and
    derive the value of the TE in the second pulse sequence based on the operation that is received from the user based on the image that is presented on the display.

5. The magnetic resonance imaging apparatus according to claim 4, wherein
    the processing circuitry is configured to receive, as the operation, an operation to select an image from multiple images, and
    is configured to derive, as the value of the TE in the second pulse sequence, a value of a TE related to the image selected by the user.

6. The magnetic resonance imaging apparatus according to claim 4, wherein
    the processing circuitry is configured to receive, as the operation, an operation to select a region of interest, and is configured to derive the value of the TE in the second pulse sequence based on the region of interest selected by the user.

7. The magnetic resonance imaging apparatus according to claim 1, wherein the processing circuitry is configured to derive the value of the TE in the second pulse sequence based on multiple images with different TEs generated based on the multiple sets of data.

8. The magnetic resonance imaging apparatus according to claim 7, wherein the processing circuitry is configured to analyze, based on the multiple images, a change in signal intensity when changing the TEs and, based on a result of the analysis, derive the value of the TE in the second pulse sequence.

9. The magnetic resonance imaging apparatus according to claim 7, wherein the processing circuitry is configured to analyze a change in signal intensity when changing the TEs based on the multiple images, generate a superimposition image where an analysis result of the analysis is superimposed on a single image, and cause a display to present the superimposition image.

10. The magnetic resonance imaging apparatus according to claim 1, wherein the sequence control circuitry is configured to acquire the multiple sets of data at a timing such that a water signal and a fat signal are in an identical phase during the first pulse sequence.

11. The magnetic resonance imaging apparatus according to claim 1, wherein the sequence control circuitry executes the second pulse sequence to acquire multiple sets of data with different TEs based on the value of the TE derived by the processing circuitry and the processing circuitry performs a process that includes a subtraction operation that is an operation to perform subtraction between two sets of data, on predetermined data among the multiple sets of data obtained during the second pulse sequence, thereby generating an image.

12. The magnetic resonance imaging apparatus according to claim 1, wherein
- in a case in which information regarding at least one of a region of interest and a body part to be imaged is known prior to a timing in which the sequence control circuitry executes the first pulse sequence, the sequence control circuitry does not execute the first pulse sequence and the processing circuitry derives the value of the TE in the second pulse sequence based on information regarding the at least one of the region of interest and the body part to be imaged and
- in a case in which information regarding at least one of the region of interest and the body part to be imaged is not known at the timing in which the sequence control circuitry executes the first pulse sequence, the sequence control circuitry executes the first pulse sequence and the processing circuitry derives the value of the TE in the second pulse sequence based on the multiple sets of data.

13. A magnetic resonance imaging apparatus comprising:
- sequence control circuitry configured to use a pulse sequence of an ultrashort echo time (UTE) imaging technique to acquire multiple sets of data with different echo times (TEs) at a timing such that a water signal and a fat signal are in an identical phase; and
- processing circuitry configured to perform, on predetermined data among the multiple sets of data, a subtraction operation between two sets of data, thereby generating a subtraction image.

14. A magnetic resonance imaging method executed by a magnetic resonance imaging apparatus, including:
- executing, by sequence control circuitry, a first pulse sequence, the first pulse sequence being a pulse sequence of an ultrashort echo time (UTE) imaging technique and being a multi-echo pulse sequence;
- acquiring, by the sequence control circuitry, multiple sets of data with different echo times (TEs); and
- deriving, by processing circuitry, a value of a TE (Echo Time) in a second pulse sequence executed by the sequence control circuitry based on the multiple sets of data.

* * * * *